US008371728B2

(12) United States Patent
Hente et al.

(10) Patent No.: US 8,371,728 B2
(45) Date of Patent: Feb. 12, 2013

(54) CONTROL MODULE FOR A LIGHTING SYSTEM, LIGHTING SYSTEM AND LIGHT MODULE FOR A LIGHTING SYSTEM

(75) Inventors: Dirk Hente, Wuerselen (DE); Joseph Hendrik Anna Maria Jacobs, Eygelshoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 628 days.

(21) Appl. No.: 12/525,850

(22) PCT Filed: Feb. 7, 2008

(86) PCT No.: PCT/IB2008/050438
§ 371 (c)(1),
(2), (4) Date: Jan. 13, 2010

(87) PCT Pub. No.: WO2008/099305
PCT Pub. Date: Aug. 21, 2008

(65) Prior Publication Data
US 2010/0124067 A1 May 20, 2010

(30) Foreign Application Priority Data
Feb. 12, 2007 (EP) .................................... 07102169

(51) Int. Cl.
*F21V 21/00* (2006.01)
*F21V 21/096* (2006.01)

(52) U.S. Cl. ......... 362/398; 362/648; 362/406; 362/430

(58) Field of Classification Search .................. 362/398, 362/648, 404, 406, 427, 430
See application file for complete search history.

(56) References Cited

U.S. PATENT DOCUMENTS

| 4,688,154 | A | | 8/1987 | Nilssen |
| 4,719,549 | A | * | 1/1988 | Apel .............................. 362/398 |
| 2001/0048234 | A1 | | 12/2001 | Liu et al. |
| 2003/0179578 | A1 | | 9/2003 | Albert et al. |
| 2004/0061694 | A1 | | 4/2004 | Noguchi et al. |
| 2007/0188427 | A1 | * | 8/2007 | Lys et al. ......................... 345/82 |
| 2009/0310362 | A1 | * | 12/2009 | Weij ......................... 362/249.02 |

FOREIGN PATENT DOCUMENTS

| DE | 1803197 U | 12/1959 |
| DE | 29905034 U1 | 7/1999 |
| DE | 20307450 U1 | 10/2003 |
| EP | 1120838 A2 | 8/2001 |
| EP | 1586810 A2 | 10/2005 |
| EP | 1733653 A2 | 12/2006 |
| WO | 2006023901 A2 | 3/2006 |

* cited by examiner

*Primary Examiner* — Karabi Guharay
(74) *Attorney, Agent, or Firm* — Mark Beloborodov; David Zivan

(57) ABSTRACT

The present invention relates to a control module (30) for a lighting system, which lighting system (10) comprises a base module (11) with at least two parallel electrodes (16) and at least one light module (20) coupled with said electrodes (16), said control module comprising: a controller (30) adapted to control at least one parameter of the at least one light module (20), and a holding member (28) adapted to removably hold said control module in engagement with said electrodes (16) of said lighting system (10). It also relates to a lighting system and a light module (20) for such a lighting system.

18 Claims, 7 Drawing Sheets

US 8,371,728 B2

CONTROL MODULE FOR A LIGHTING SYSTEM, LIGHTING SYSTEM AND LIGHT MODULE FOR A LIGHTING SYSTEM

FIELD OF THE INVENTION

The present invention relates to a control module for a lighting system, which lighting system comprises a base module with at least two parallel electrodes and at least one light module coupled with said electrodes. The invention also relates to a lighting system and a light module for a lighting system.

BACKGROUND OF THE INVENTION

Lighting systems are generally known, e.g. lighting systems with LEDs or halogen lamps. It is also known to use elongated parallel extending electrodes, for example in form of cables or rods which are supplied with the supply voltage and on which the lamps are attached. The control element for switching on and off or for adjusting the brightness of such a lighting system is often central for all lamps and often remote of the system at a fixed place. Typically, the central control element is hidden and therefore not easily reachable by the user. Having a control unit in each light element, complicates its usage when a group of light elements should have the same properties, such as brightness and/or color.

Although such lighting systems are convenient to use, there is still the desire to improve the system, particularly the disadvantage mentioned above.

SUMMARY OF THE INVENTION

Therefore it is an object of the present invention to improve the lighting system as mentioned above, particularly in terms of usability and costs.

This object is solved by a lighting system as defined in claim 12, a control module as defined in claim 1 and a light module as defined in claim 18.

The control module as mentioned above comprises a controller adapted to control at least one parameter of the at least one light module and a holding member adapted to removably hold said control module in engagement with said electrodes of said lighting system.

In other words, the control module which serves to adjust the brightness of the light modules, for example, is not provided at a fixed place, but is instead a transportable unit which can be attached and removed to and from a base module of a lighting system easily via a holding member.

The inventive control module allows to use it for example for several lighting systems and is hence not fixedly coupled with one single lighting system. Particularly, it would be possible with the inventive control module to attach it at the base module of a first lighting system as to adjust for example the brightness of the light modules of this lighting system. Afterwards, the control module can be removed and for example attached to a base module of a second lighting system as for example to adjust the color of the respective light modules.

It is apparent that the inventive control module achieves several advantages over the known systems, particularly with respect to usage and costs. Moreover, the possibility to easily remove the control module has the advantage that the design is not affected by the control module.

In a preferred embodiment, at least two electrode connector elements adapted to electrically interact with said electrodes are provided.

This means in other words that the electrodes on the control module serving to provide an electrical connection with the electrodes of the base module are provided as connector elements, preferably as flat two-dimensional elements. The flat electrode design has been proved advantageous in practice. However, it is to be noted that the electrodes on the control module can be formed differently (e.g. as pins) as far as it is ensured that a reliable electrical contact between the control module and the base module is achieved.

In a preferred embodiment, said holding member comprises at least one magnet adapted to fix said control module at said base module.

This measure has the advantage that the holding member is very easily to use. The user only has to put the control module on the base module of the lighting system without operating any holding elements.

However, it is to be noted that said holding member can also be provided differently. For example, the holding member may comprise at least one holding clamp or for example at least one screw connection. In both cases, the user has to put the control module on the base module and must then operate the holding clamp or the screw to fix the control module at the base module.

In a preferred embodiment, a positioning member adapted to engage with a counterpart member provided at said base module is provided.

This means in other words that the control module and the base module carry elements serving to align both modules to each other. This measure has the advantage that it is ensured that the control module is hold at the base module in the appropriate position so that the electrode connector elements of the control module are in electrical contact with the electrodes of the base module.

In a further preferred embodiment, said controller is adapted to receive energy for its operation via said electrodes of the base module and to transmit control signals for controlling a light module via said electrodes.

This means in other words that the control signals are transmitted over those electrodes which are also used for supplying energy. The control signals are for example modulated for transmission over the supply lines. Of course, other methods for transmitting signals over supply lines are also known and may be used.

The advantage of this measure is that only two electrodes have to be provided so that the base module may be designed very small and almost invisible.

In a further preferred embodiment, said lighting system comprises two energy supplying electrodes and one data electrode and said controller is adapted to receive energy for operation via said energy supplying electrodes and to transmit control signals via said data electrode.

In contrast to the afore-mentioned solution, a further electrode is provided which is solely used for transmitting the control signals. Hence, it is not necessary e.g. to modulate the control signals as to discriminate it from the supply voltage as it is the case in the afore-mentioned solution. Hence, this embodiment reduces the circuitry in the control and light modules, however, requires one additional electrode.

In a preferred embodiment, a control element for manually adjusting said parameter is provided. Preferably, said control element is a rotary switch for adjusting the brightness and/or color of said at least one light module.

This means in other words that the control module carries all parts necessary for adjusting parameters of the light module. Hence, it is easy to use and handle.

In a further preferred embodiment, the control module comprises a converter for converting the supply voltage and/or current to a different voltage/current.

This measure has the advantage that the flexibility of the whole system may be increased since the power supply may be selected independently of the control module.

The object of the present invention is also solved by a light system comprising a base module having a substrate and at least two parallel electrodes on said substrate; at least one light module having a light element, at least two electrode connector elements and a holding member adapted to removably hold said light module at said substrate such that said electrode connector elements are in an electrical contact with said electrodes, and a control module as described above.

The advantages of this lighting system has already been set forth above so that it is not necessary to repeat them again.

It is to be noted that the expression "parallel electrodes" in the context of this description means that the electrodes have always the same distance between each other. Hence, "parallel electrodes" also mean that the electrodes may be designed as concentric circles or as curved lines. It is not required that the electrodes are designed as straight lines.

In a preferred embodiment, said substrate is a printed circuit board and said electrodes are circuit board conductor lines.

This measure results in a reduction of manufacturing costs.

In a further preferred embodiment, three parallel electrodes are provided, two of which serving as supply lines and one as a data line.

The advantages of this measure have already been described above.

In a preferred embodiment, said substrate comprises areas carrying a magnetic material interacting with magnets of a holding member of a control or light module.

This measure has the advantage that the holding function between the base module and the control or light module is achieved very easily. Moreover, the position of the control or light modules on the base module may be selected arbitrarily. In other words, the control or light modules may be freely placed on the base module.

In a preferred embodiment, said substrate has positioning elements adapted to interact with positioning members of said control or light modules.

This measure has the advantage that a proper electrical contact between the electrode connector elements of the control or light modules and the electrodes of the base module is achieved. The positioning elements and members serve to adjust the control or light modules at least in a direction perpendicular to the extension of the electrodes of the base module.

In a further preferred embodiment, said light module comprises a memory element for storing a parameter transmitted by said control module.

This measure has the advantage that the light module can be operated with the desired parameter even when the control module has been removed. The desired parameter which has been previously transmitted by the control module is stored in the memory element and may be used by the respective controller of the light module.

It is to be noted that "memory element" in the context of the present invention means any type of device adapted to store an address necessary for addressing a light module. For example, said memory element may be provided in form of an EPROM, or EEPROM or an internal memory cell of a microcontroller, or any other type of a writable/non-writable memory, which are generally known in the art. Further, switches, like DIP-switches etc., are also usable for storing an address value and are therefore also to be considered as a "memory element".

The object of the present invention is also solved by a light module for a lighting system as defined above, which comprises a frame, at least one light element, at least two electrode connector elements adapted to be connectable with said electrodes of said base module, a holding member adapted to removably hold said light module at said base module, and a controller for controlling said light element dependent on a parameter received from a control module as defined above.

The advantages of such a light module are the same as described above so that it is refrained from repeating same.

Further features and advantages can be taken from the following description and the enclosed drawings.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

Embodiments of the invention are shown in the drawings and will be explained in more detail in the description below with reference to same. In the drawings.

DETAILED DESCRIPTION OF EMBODIMENTS

Figure 1:
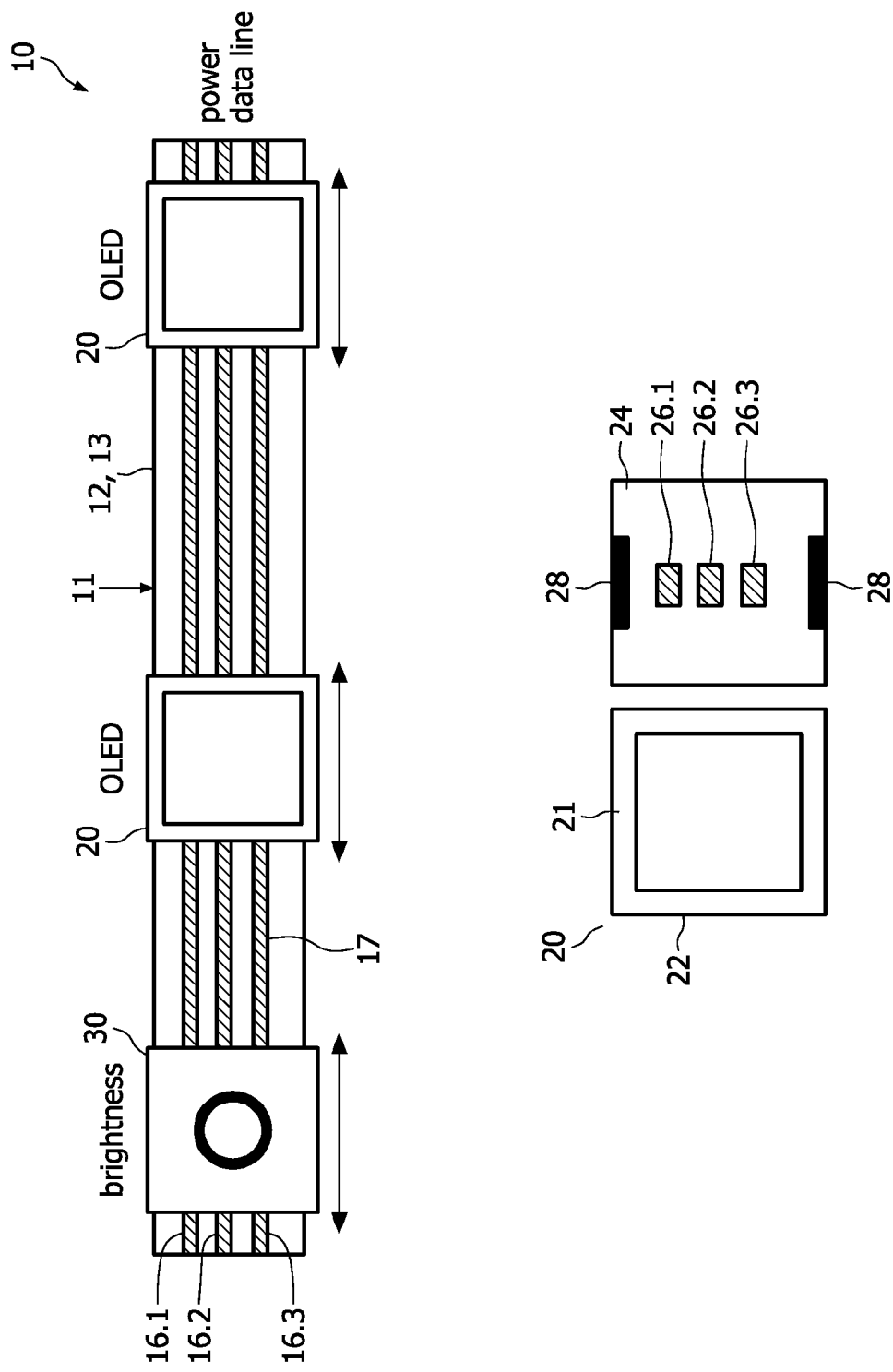
FIG. 1 is a schematic block diagram of a lighting system according to the present invention and a single light module.

In FIG. 1 a lighting system is schematically shown with its main parts and is referenced with reference numeral 10. The lighting system generally serves to radiate light, for example to illuminate a room, etc.

The lighting system 10 comprises a base module 11, one or more light modules 20 and a control module 30.

The base module 11 comprises a substrate 12, for example a printed circuit board 13 and at least two, preferably three electrodes 16.1 to 16.3. In the example shown in FIG. 1, the electrodes 16.1 to 16.3 are printed circuit board conductor lines 17 which extend parallel to each other and in a straight line. In the context of the present invention, "parallel" means that the electrodes 16 are placed in such a way that the distance between them does not change over their complete length. Parallel, however, does not mean that the electrodes have to extend along a straight line. The electrodes may also be provided as concentrical circles or rings as it will be described later.

Two of the electrodes 16.1, 16.2 are used for supplying power and the third electrode 16.3 is used as a data line. The length of the base module, particularly the substrate 12, may be freely selected dependent on the specific application of the lighting system.

The light module 20 comprises a frame 21, for example in a rectangular design, supporting a substrate on which at least one light element 42 is provided. The light element 42 may be an organic light emitting diode (OLED) as in the present embodiment, or any other electrically powered light element, like light emitting diodes, halogen lamps, etc.

The light element 42 is provided on the front side 22 of the frame 21, whereas the back side 24 carries at least two, preferably three electrode connector elements 26.1 to 26.3. The electrode connector elements are provided for example as flat electrode pads or connector pins dependent on the application. The electrode connector elements 26 have to be adapted to the electrodes 16, particularly in terms of their spatial position and their size. The electrode connector elements 26 have to contact the respective electrodes 16 when properly positioned on the substrate 12.

The light module 20 also comprises holding members 28 which are designed to engage the substrate 12 as to hold and fix the light module 20 on the substrate 12.

The control module 30 has a back side which is similar to the back side of the light module 20, meaning that it comprises electrode connector elements and holding members 28. The front side of the control module 30 supports a rotary switch which can be manually operated by the user.

In operation, the electrodes 16.1 and 16.2 of the base module 11 are supplied with a supply voltage, which is received by the control and light modules 30, 20 via the electrode connector elements 26.1 and 26.2. The supply voltage is used to power the light elements of the light modules 20 and a controller circuit on the control module 30.

Via the third electrode 16.3, the control module 30 transmits parameter signals dependent on the operation of the rotary switch 34, which parameter signals are received by the light modules 20 and are used to adjust the light elements according to the desired parameter. Brightness and color of the light elements may be such parameters.

Hence, the control module 30 attached to the base module 11 allows to control the light modules 20 also attached to the base module 11.

As indicated by the arrows in FIG. 1, the light modules as well as the control module are first freely movable along the length of the substrate 12 (that is parallel to the electrodes 16) and second are freely removable from the substrate by operating the holding member 28.

Hence, the lighting system is very flexible with respect to the positions of the light modules, and is easy to control by using the control module 30 which can also be attached to the substrate 12 at any position along the length of the substrate.

As already mentioned above, the control module generates and transmits a control signal via electrode 16.3 which signal is representing a desired light parameter (brightness and/or color). This control signal may be received by any light module 20 attached to the substrate 12 and may be used to adjust the light element accordingly.

Figure 2:
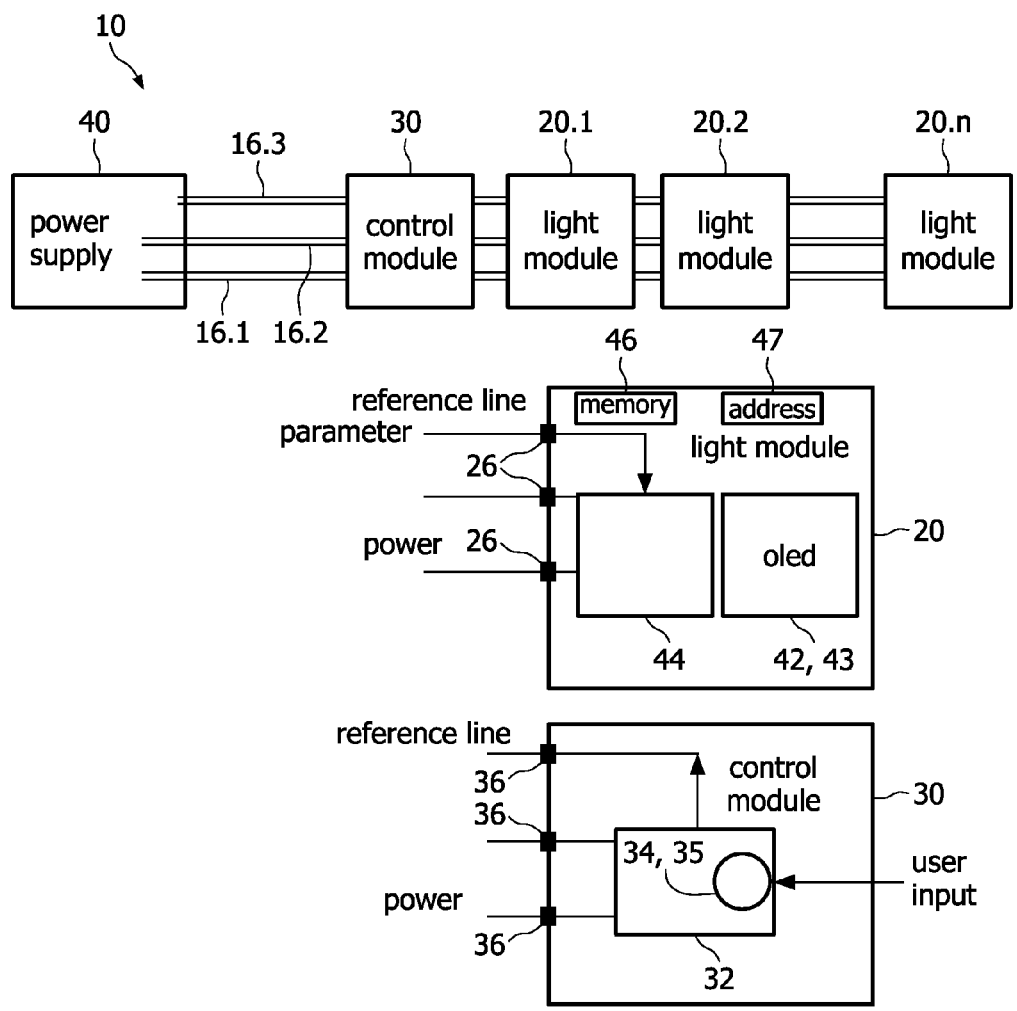
FIG. 2 is a schematic block diagram showing the components of a light module and a control module and the whole lighting system.

In FIG. 2, a schematic block diagram of the components of the lighting system 10 as well as the main circuit components of the light module and the control module are shown. However, it is to be noted that these block diagrams only show the main circuit parts and not every circuit necessary for achieving the described functions. A skilled person knows how to design the circuitry as to achieve the mentioned functions.

The lighting system 10 as shown in FIG. 2 comprises at least three electrodes 16 connecting a control module 30 and several light modules 20.1 to 20.*n*. The supply voltage electrodes 16.1, 16.2 are electrically coupled with a power supply unit 40 which may be part of the lighting system 10 or which may be an external unit. The power supply unit 40 may be for example an AC/DC converter with an output voltage of 12 V. However, other voltages may also be possible depending on the application.

The light module 20 comprises three electrode connector elements 26, two of which are electrically coupled with a power supply converter/controller circuit 44. This circuit 44 powers a light element 42, which may be provided as an organic light emitting diode (OLED) 43.

Further, the light module 20 comprises a memory 46 for storing at least one parameter value transmitted by the control module 30. Optionally, a further memory 47 may be provided for storing address data. As will be described below, this memory opens the possibility to address each individual light module via the control module.

As already mentioned in the above, the memory 47 may be provided in form of an electronic memory, like EPROM, EEPROM, etc., or in form of an mechanical memory, like a DIP-switch, etc.

The control module 30 comprises a controller circuit 32 which is electrically coupled with the electrode connector elements 36. Further, the control module 30 has a controller element 34 which is for example a rotary switch 35.

The controller circuit 32 is powered via the power supply electrodes 16.1, 16.2 and generates control signals carrying a parameter which represents the brightness or color value given by the user by operating the rotary switch 35. This control signal is transmitted via the third electrode 16.3 and is received by the controller circuit 44 of the light modules 20. Further, the transmitted parameter value is stored in the memory 46. Beside the brightness or color parameter, the control module 30 may also transmit a signal representing an instruction for the light modules 20 to switch on or off.

As already mentioned above, the light modules 20 as well as the control module 30 can make a translatory movement along the length of the substrate 12, as indicated by the arrows shown in FIG. 1. Hence, the light modules as well as the control module 30 are almost freely placeable with the advantage that the control module 30 may be placed at a position allowing a convenient operation of the operating element 34 by the user.

As already mentioned before, in a preferred embodiment, the light modules may comprise an address memory 47 allowing to transmit control signals to individual light modules. Each light module 20 has its own address stored in the address memory 47—either set automatically or manually. The address is unique to each module 20 and allows the independent control of the individual light modules independently of each other. The address is preset by the manufacturer and can be modified by the user of the light system. The addresses may also be used to build groups of light modules which can be controlled independently by the controller. A group comprises one or more light modules 20.

A communication protocol for the control data ensures the communication between the light modules 20 and the control module 30. Such kind of communication protocol can be a standard one, e.g. DALI; DMX or a proprietary one.

Optionally, the control module 30 has an interface to an external host computer. The host computer might be used for easy set up of the lighting system.

Figure 3:
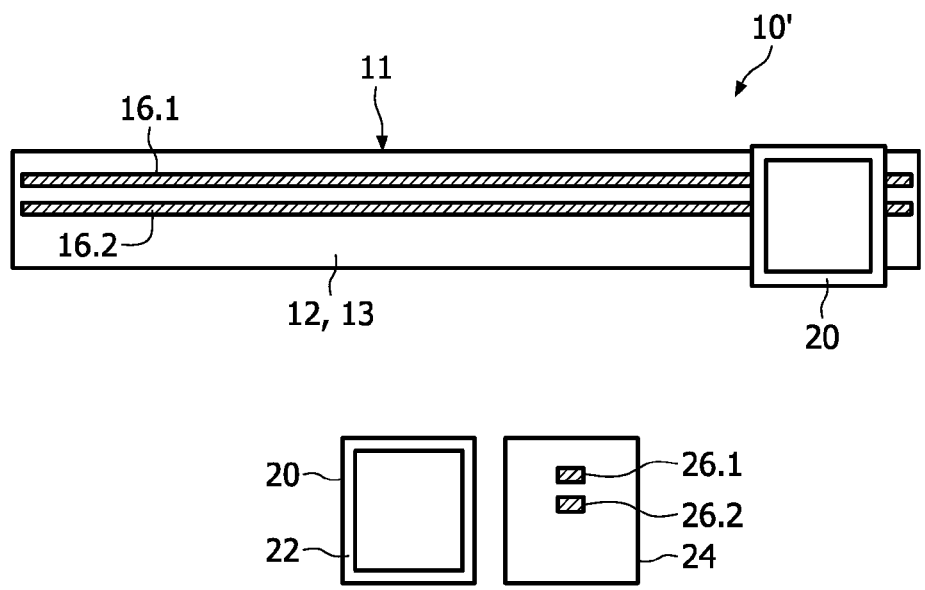
FIG. 3 is a schematic diagram of a lighting system with two electrodes.

In FIG. 3 a further example of a lighting system 10' is schematically shown. The only difference to the lighting system shown in FIG. 1 is that the base module 11 only comprises two elongated parallel electrodes 16.1 and 16.2. Both electrodes 16 are not only provided for supplying power but are also used to transmit control signals generated by the control module 30 (which is not shown in FIG. 3). Since only two electrodes are used, it is necessary to transmit the control signal in a manner allowing to discriminate this signal at the light modules. In the art, several methods are known, for example power line protocols using modulated signals for transmitting information.

A further possibility to transmit control signals from the control module to the light modules of the lighting system 10 is to use wireless RF or infrared communication. Further it is to be noted that the communication for transmitting control signals can be done analog or digital.

According to the design of the base module 11, the light module (as well as the control module 30) comprises only two electrode connector elements 26.1 and 26.2.

Figure 4:
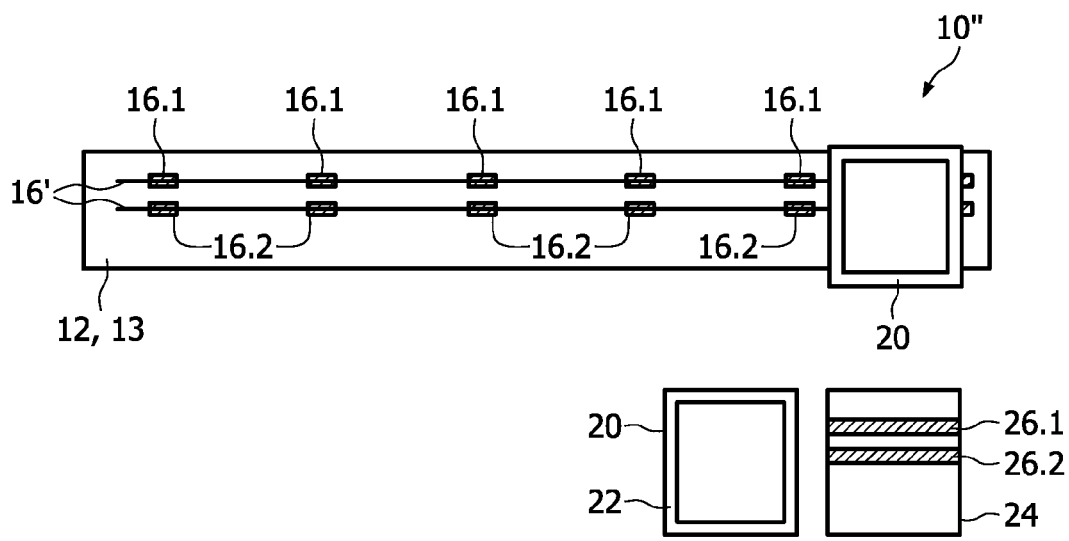
FIG. 4 is a schematic diagram of a lighting system having two electrodes which are each divided into a plurality of electrode sections.

In FIG. 4, a further embodiment of a lighting system is schematically shown and indicated with reference numeral 10″. The only difference to the aforementioned system is the design of the electrodes 16. Here, the elongated electrodes 16 of the afore-mentioned embodiments are separated in a plurality of short electrode sections which are evenly spaced along the length of the substrate 12. However, all electrode sections of electrode 16.1 and 16.2, respectively, are electrically connected via a connection line 16′, which, however, lies in a different layer of the substrate 12.

According to the design of the electrode sections 16.1 and 16.2, the electrode connector elements of the light module (as well as the control module) are provided as elongated connector lines 26.1, extending along the entire length of the modules 20, 30. The distance between two adjacent electrode sections 16.1, 16.2 is selected such that an electric contact with the electrode connector elements 26 of the modules 20, 30 is ensured irrespective of the position in the longitudinal direction of the substrate.

Figure 5:
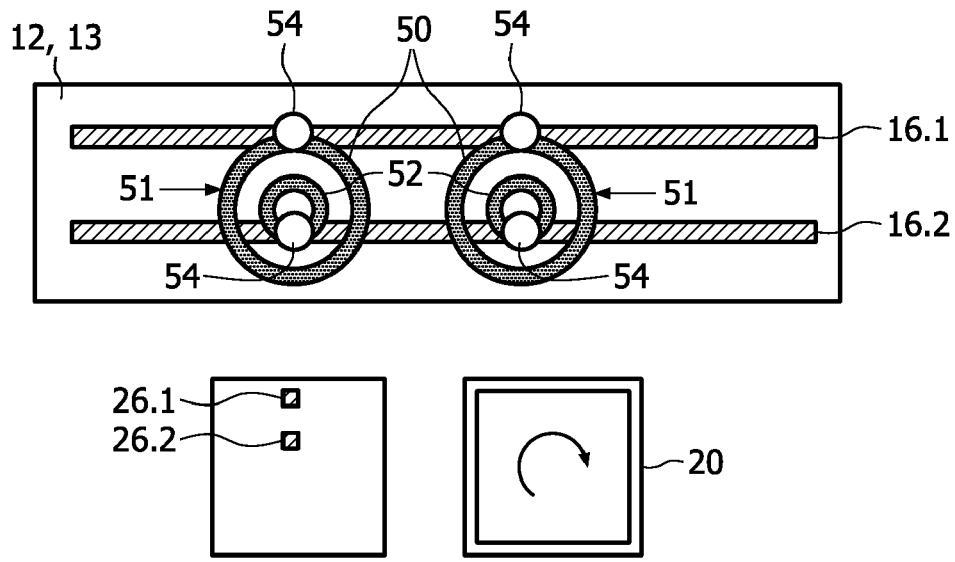
FIG. 5 is a schematic block diagram of a lighting system with circular or ring-shaped electrodes.

In FIG. 5 a further embodiment of a lighting system is schematically shown. In contrast to the previous embodiments, the substrate 12 carries a plurality of electrode pairs 51, each electrode pair 51 comprising two circular or ring-shaped electrode lines arranged concentrically. The outer circular electrode line is referenced with numeral 50 and the inner circular electrode line is referenced with numeral 52.

It is further schematically shown in FIG. 5 that each electrode line 50, 52 is connected with electrode 16.1 and electrode 16.2, respectively. Since both electrodes 16 extending in a different layer, interconnection points 54 are provided connecting the electrode lines 50, 52 with the respective electrode 16.1, 16.2.

The electrode pairs 51 allow a rotatory movement of the light module 20 on the substrate 12. This is illustrated by the arrow on the front side of the light module 20. On the back side of the light module 20, two electrode connector elements 26.1, 26.2 are provided, their distance to each other being the same as the distance between the circular electrode lines of an electrode pair. Hence, the electrode connector elements 26 are always in contact with the respective circular electrode lines 50, 52 irrespective of the angular position of the light module 20.

Figure 6:
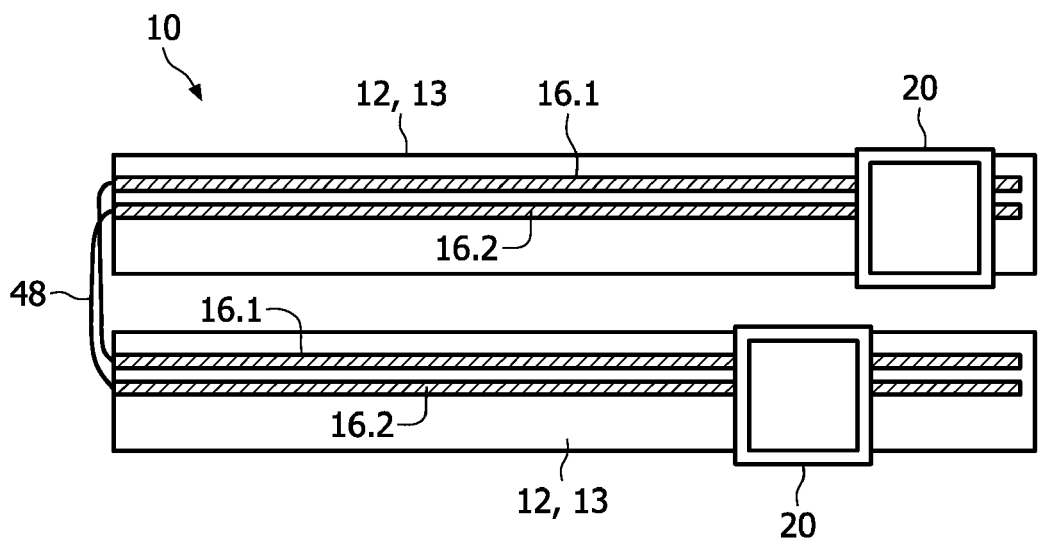
FIG. 6 is a schematic block diagram of cascaded base modules forming a lighting system.

In FIG. 6 it is schematically shown that two or more substrates 12 may be cascaded by interconnecting their electrodes 16 via connection lines 48. This cascaded arrangement of the substrates 12 allows a matrix arrangement of light modules 20.

Figure 7:
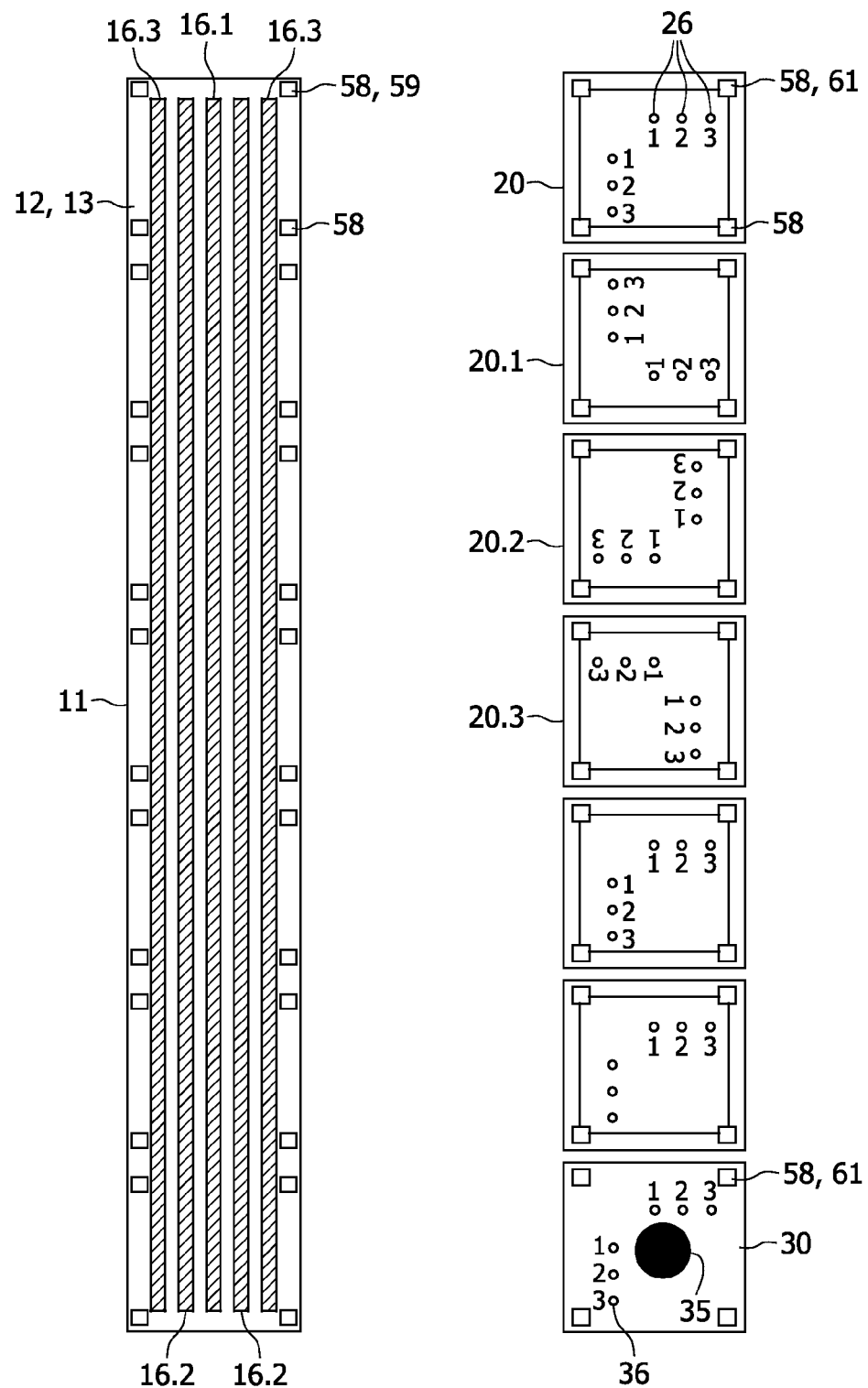
FIG. 7 is a schematic block diagram of a lighting system having five electrodes.

In FIG. 7 a further embodiment of a lighting system is shown. It is a scalable lighting system with rotatory proof placement of light and control modules 20, 30. The left part shows the base module 11 comprising a substrate 12 carrying five electrodes 16.1, 16.2 and 16.3. The middle electrode 16.1 is externally connected to the ground potential (GND). Its both adjacent electrodes 16.2 are internally connected to each other and externally supplied by a positive supply voltage. The two remaining outer electrodes 16.3 are data line electrodes.

On the right hand side, plural identically structured light modules 20 and a control module 30 are shown. The control module 30 comprises six pin-shaped electrode connector elements 36. Depending on the displacement angle of the control module 30 on the substrate 12, three of these electrode connector elements 36 are connected to the electrodes 16 of the base module if placed on it. Element 1 will be connected to GND and element 2 will be connected to the positive supply voltage.

The control module generates a reference signal or control signal, which is transmitted to the outer two electrodes of the base module via element 3 of the control module. The signal can be adjusted by rotating the rotary switch 35 enabling dimming of the light modules 20. If placed on the base module, the electrode connector elements 26 of the other six light modules shown in FIG. 7 will be connected to ground, to the supply voltage and to the reference signal, respectively. The potentials applied to the three electrodes 16.1 to 16.3 are sent to the controller of the light modules 20 which control the current through the light element, for example an OLED.

In FIG. 7, the substrate 12 carries several positioning elements 58 which may be provided as holes or recesses 59. The positioning elements are arranged at the outer longitudinal areas of the substrate in a predetermined pattern depending on the design of the used light and control modules.

The positioning elements serve to position the light or control module on the substrate 12.

In order to achieve this positioning function, each light and control module 20, 30 is provided with a counterpart positioning element, for example in form of pins 61 engaging with the recesses 59.

Figure 8:
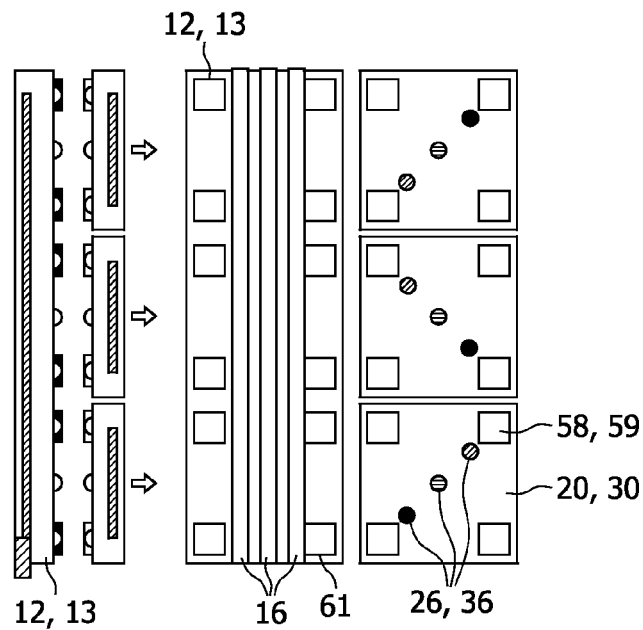
FIG. 8 is a schematic block diagram of a lighting system with three electrodes.
Figure 8:
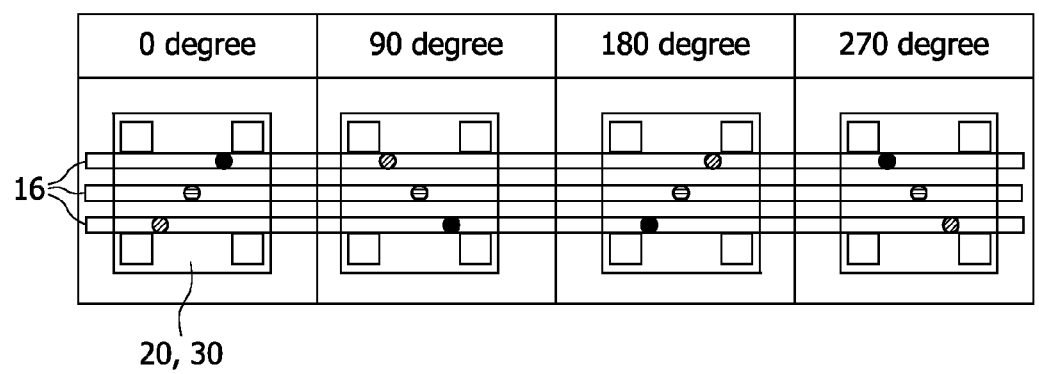

In FIG. 8, a further embodiment of a lighting system is shown. The substrate 12 comprises a plurality of electrodes 16 or electrode sections 16 (for example in form of electrode points or pins) which are arranged in three lines and which are connected to respective electrodes 16′ lying in a different layer beneath the electrode sections 16.

The electrode sections 16 in the middle are supplied with ground and the other ones with the supply voltage. This specific pattern of electrode connector elements of the control and light modules 20, 30 allows to rotate the modules 20, 30 in 90° steps as shown in the lower part of FIG. 8. Further, positioning elements 59 and 61 are provided to align each module 20, 30 in the longitudinal direction of the substrate 12.

In this embodiment it would also be possible to use the middle electrode 16 as data line and the outer electrodes 16 as supply lines. However, contrary to the aforementioned embodiment each light module 20 must comprise a polarity switch since the polarity is dependent on the rotary position of the light module.

As already mentioned above, the light and control modules 20, 30 are provided with holding members used to hold them in a fixed position on the substrate 12.

Figure 9:
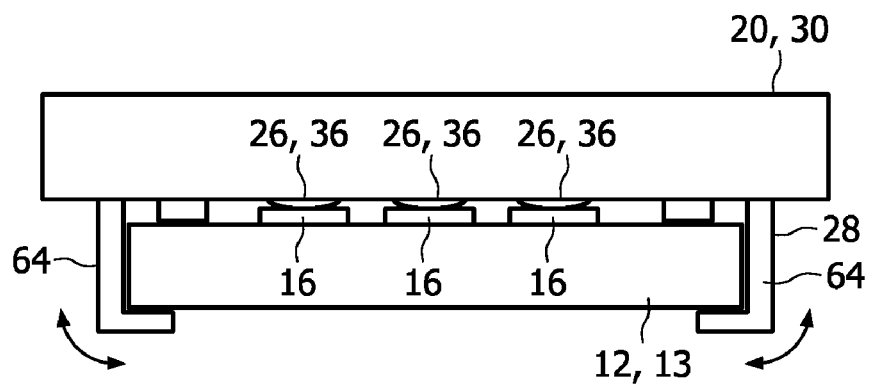
FIG. 9 shows three different examples of a holding member for fixing a control or light module at the base module.
Figure 9:
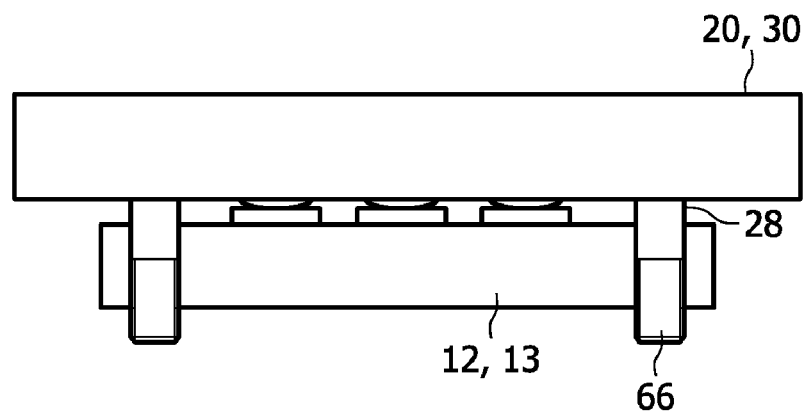
Figure 9:
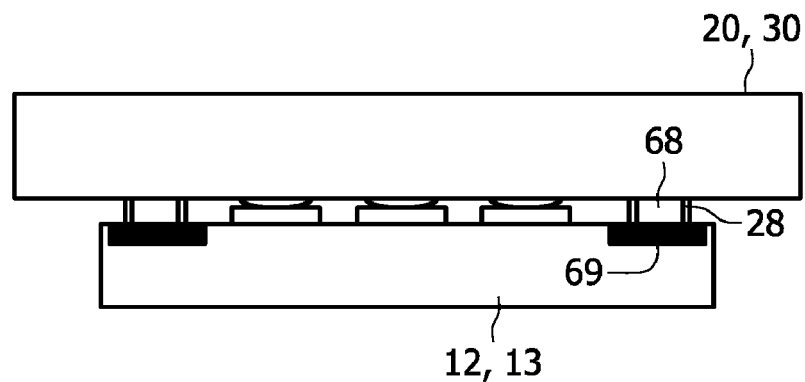

There are a plurality of different possibilities to design such holding members, three of such possibilities being shown in FIG. 9.

One solution for a holding member 28 is to provide pivotable clamps 64 on the back side of a light or control module 20, 30. The clamps 64 engage the back side of the substrate 12 achieving the necessary fixation.

A further shown possibility is to use known screw connections 66.

However, one of the preferred possibilities is to use magnetic force to hold the control and light modules 20, 30 in position. In the shown diagram, the substrate comprises magnetic areas 69 which may extend along the entire length of the substrate. Each light and control module 20, 30 comprises at least two magnets 68 arranged to cooperate with the magnetic areas 69 of the substrate.

In view of the above, it is apparent that according to the present invention the light modules as well as the control module may be freely placeable and removable on and from the base module of the lighting system which offers increased design flexibility and improves handling and operating of the lighting system particularly by the possibility to freely place the modules.

The invention claimed is:

1. Control module for a lighting system comprising a base module comprising a plurality of electrodes in electrical communication with a power source and at least one light module coupled to said electrodes for receiving electric power therefrom, said control module comprising:
a controller circuit for controlling at least one parameter of the at least one light module;
a holding member for removably holding said control module in engagement with said electrodes for providing electric power to the control module; and
a plurality of electrical connectors that are configured to connect to said electrodes in a plurality of different orientations, wherein each of said orientations renders said controller circuit operable for controlling the at least one parameter.

2. Control module of claim 1, wherein the at least one parameter comprises at least one of brightness or a color of light.

3. Control module of claim 1, wherein said holding member comprises at least one magnet adapted to fix said control module at said base module.

4. Control module of claim 1, wherein said holding member comprises at least one holding clamp or at least one screw connection.

5. Control module of claim 1, further comprising a positioning member adapted to engage with said base module.

6. Control module of claim 1, wherein said control module is movable parallel to said electrodes and removable from the lighting system by operating the holding member.

7. Control module of claim 1, wherein the at least one parameter of the at least one light module is controlled via a control signal transmitted via said electrodes.

8. Control module of claim 1, further comprising a data electrode for transmitting a control signal for controlling the at least one parameter of the at least one light module.

9. Control module of claim 1, further comprising a control element for manually adjusting the at least one parameter.

10. Control module of claim 1, further comprising an interface to an external host computer.

11. Control module of claim 1, wherein the plurality of different orientations includes at least three different orientations.

12. Lighting system comprising:
a base module having a substrate and at least two a plurality of parallel electrodes on said substrate;
at least one light module, coupled to said electrodes for receiving electric power therefrom, said light module comprising:
a light element,
a plurality of electrode connector elements connectable to said electrodes of said base module, and
a first holding member for removably holding said light module in engagement with said base module; and
a control module comprising:
a controller circuit for controlling at least one parameter of the at least one light module,
a second holding member for removably holding said control module in engagement with said electrodes for providing electric power to said control module,
wherein at least one of said at least one light module or said control module is configured to be electrically connectable to said electrodes in a plurality of different orientations, wherein each of said orientations enables said controller circuit to control the at least one parameter.

13. Lighting system of claim 12, wherein said substrate is a printed circuit board and said electrodes are circuit board conductor lines.

14. Lighting system of claim 12, wherein at least one of said holding members comprises a plurality of magnets and wherein said substrate comprises areas carrying a magnetic material interacting with said magnets.

15. Lighting system of claim 12, wherein the plurality of different orientations includes at least three different orientations.

16. Light module for a lighting system comprising a base module comprising a plurality of substantially parallel electrodes, said light module being coupled to said electrodes for receiving electric power therefrom, said light module comprising:
a holding member for removably holding said light module in engagement with said base module;
a controller circuit for controlling at least one parameter of said light module; and
a plurality of electrical connectors that are configured to connect to said electrodes in a plurality of different orientations, wherein each of said orientations renders said controller circuit operable for receiving instructions for controlling the at least one parameter.

17. Light module of claim 16, further comprising a light element that comprises at least one light emitting diode or a halogen lamp.

18. Light module of claim 16, wherein the plurality of different orientations includes at least three different orientations.

* * * * *